(12) United States Patent  
Nagano et al.

(10) Patent No.: US 11,397,195 B2
(45) Date of Patent: Jul. 26, 2022

(54) CORE FOR ELECTRIC CURRENT DETECTOR AND METHOD FOR MANUFACTURING THE SAME

(71) Applicant: SHT Corporation Limited, Izumisano (JP)

(72) Inventors: Ai Nagano, Izumisano (JP); Nobuhiro Kitai, Izumisano (JP)

(73) Assignee: SHT CORPORATION LIMITED, Osaka (JP)

( * ) Notice: Subject to any disclaimer, the term of this patent is extended or adjusted under 35 U.S.C. 154(b) by 325 days.

(21) Appl. No.: 16/599,286

(22) Filed: Oct. 11, 2019

(65) Prior Publication Data
US 2020/0116760 A1 Apr. 16, 2020

(30) Foreign Application Priority Data

Oct. 16, 2018 (JP) .............................. JP2018-195125

(51) Int. Cl.
*G01R 15/18* (2006.01)
*G01R 19/00* (2006.01)
(Continued)

(52) U.S. Cl.
CPC ....... *G01R 15/183* (2013.01); *G01R 19/0092* (2013.01); *H02K 3/50* (2013.01); *H02K 3/47* (2013.01); *H02K 3/522* (2013.01)

(58) Field of Classification Search
CPC ... G01M 99/008; G01M 99/005; G01L 25/00; A61M 5/00; A61M 2209/02;
(Continued)

(56) References Cited

U.S. PATENT DOCUMENTS

| 6,246,172 B1* | 6/2001 | Bizen | H01F 41/0226 |
| | | | 315/5.41 |
| 2009/0128129 A1* | 5/2009 | Aratani | G01R 15/207 |
| | | | 324/117 H |
| 2010/0090685 A1* | 4/2010 | Andrieu | G01R 15/207 |
| | | | 324/117 R |

FOREIGN PATENT DOCUMENTS

| JP | 2007-88019 A | | 4/2007 | |
| JP | 2013120106 A | * | 6/2013 | |
| JP | 2018056343 A | * | 4/2018 | ............. H01F 41/12 |

OTHER PUBLICATIONS

English translation for JP-2013120106-A (Year: 2013).*
English translation for JP-2018056343-A (Year: 2018).*

* cited by examiner

*Primary Examiner* — Douglas X Rodriguez
*Assistant Examiner* — Byung Ro Lee
(74) *Attorney, Agent, or Firm* — Eckert Seamans Cherin & Mellott, LLC

(57) ABSTRACT

The present invention provides a core for an electric current detector in which a plurality of gaps can be formed while the paring of core pieces is maintained, and a method for manufacturing the same. A core for an electric current detector 10 according to the present invention includes: a pair of core pieces 20 and 23 that are obtained by cutting an annular core main body 12 in a radial direction at two positions and are arranged such that cross-sectional surfaces 21 and 24 are opposed to each other with a first gap 26 and a second gap 28 being interposed therebetween; and a first partial molding 30 and a second partial molding 40 that are made of resin and cover portions of the peripheral surfaces of the cross-sectional surfaces of the core pieces opposed to each other with the first gap and the second gap being interposed therebetween. The first partial molding includes (Continued)

a bridge portion 33 that serves as a connection portion and spans the gap.

6 Claims, 3 Drawing Sheets

(51) Int. Cl.
 *H02K 3/50* (2006.01)
 *H02K 3/47* (2006.01)
 *H02K 3/52* (2006.01)
(58) Field of Classification Search
 CPC ...... A61M 5/14248; A61M 2205/3331; A61M 2205/70; A61M 5/20; A61M 2005/3142; A61M 5/3129; F04B 51/00; G01F 25/0084; B29L 2031/7544
 USPC ........................................................ 324/127
 See application file for complete search history.

CORE FOR ELECTRIC CURRENT DETECTOR AND METHOD FOR MANUFACTURING THE SAME

BACKGROUND OF THE INVENTION

1. Field of the Invention

The present invention relates to a core for an electric current detector and a method for manufacturing the same. More specifically, the present invention relates to a core in which a plurality of gaps are formed in a core main body, and a method for manufacturing the same.

2. Description of Related Art

An electric current detector having a configuration in which a busbar is arranged on the inner peripheral side of a core produced by forming a gap in an annular core main body made of a magnetic material, and a magnetism detecting element is arranged in the gap is known (see JP 2007-88019A, for example).

SUMMARY OF THE INVENTION

A core in which a plurality of gaps are provided in a core main body is also proposed in order to improve the magnetic characteristics and adjust the magnetic saturation characteristics. For example, in the case of a core main body in which two gaps are formed, a magnetism detecting element is arranged in one gap, and the other gap acts to stabilize the magnetic saturation characteristics.

In the case where a single gap is formed, even after the gap has been formed by cutting an annular core main body, a core is still constituted by a single member having a substantially C shape, whereas in the case where two gaps are formed, two core pieces are formed from the core main body and come apart.

In particular, when a so-called wound core obtained by winding a belt-shaped steel plate is employed as a core main body, the position at which the winding of the steel plate is started and the position at which the winding of the steel plate is finished differ from each other in the core main body. Moreover, particularly in the case of the wound cores, if the winding strength of the steel plate varies, even the core main bodies that are wound the same number of times may vary in the cross-sectional area. Furthermore, the wound cores are annealed after the steel plates have been wound, and the residual stress due to the winding step, the annealing step, the varnish impregnation step, and the like is present in the wound core. Therefore, when the core main body is cut, the resulting core pieces may also loosen due to the restoring force of the wound belt-shaped steel plate. Accordingly, if a core is produced using core pieces that vary in the cross-sectional area or in the degree of looseness, there is a risk that the portions of the core pieces that are opposed to each other with the gap being interposed therebetween will vary in the area, the magnetic permeability will thus decrease, the desired magnetic characteristics or magnetic saturation characteristics cannot be obtained, and the linearity or error rate that indicates an error from an ideal B-H in the linear region, which is an index of the linearity, will be affected. In addition, if the positions at which the gaps are formed are not located at the center of the core main body, asymmetric core pieces will be obtained as a result of cutting the core main body to form the gaps. Therefore, the paring, that is, a proper combination of two core pieces, is important.

Accordingly, after cutting the core main bodies, it is necessary to avoid the pairing of core pieces produced from different core main bodies and use a combination of core pieces obtained from the same core main body. However, while core pieces are manufactured by cutting core main bodies and incorporated into electric current detectors, it is difficult and complicated to maintain the pair of core pieces obtained from the same core main body.

It is an object of the present invention to provide a core for an electric current detector in which a plurality of gaps can be formed while the paring of core pieces is maintained, and a method for manufacturing the same.

A core for an electric current detector according to the present invention includes:

a pair of core pieces formed by cutting an annular core main body in a radial direction at two positions, the core pieces being arranged such that cross-sectional surfaces thereof are opposed to each other with a first gap and a second gap being interposed therebetween; and a first partial molding and a second partial molding that are made of resin and cover portions of peripheral surfaces of the cross-sectional surfaces of the core pieces opposed to each other with the first gap and the second gap being interposed therebetween, wherein the first partial molding comprises a first-1 molded member that covers a peripheral surface of one of the cross-sectional surfaces of the core pieces opposed to each other with the first gap being interposed therebetween, and a first-2 molded member that covers a peripheral surface of the other of the cross-sectional surfaces of the core pieces, the second partial molding comprises a second-1 molded member that covers a peripheral surface of one of the cross-sectional surfaces of the core pieces opposed to each other with the second gap being interposed therebetween, and a second-2 molded member that covers a peripheral surface of the other of the cross-sectional surfaces of the core pieces, and at least one of connection between the first-1 molded member and the first-2 molded member via a bridge portion made of the resin or connection between the second-1 molded member and the second-2 molded member via a bridge portion made of the resin is achieved.

It is desirable that a configuration in which, in the first partial molding, the first-1 molded member and the first-2 molded member are connected via the bridge portion, and, in the second partial molding, the second-1 molded member and the second-2 molded member are not connected is employed, and the bridge portion of the first partial molding is provided with a groove, and can be folded and cut at the groove.

The bridge portion can be formed on an inner diameter side.

An electric current detector of the present invention is obtained by arranging a magnetism detecting element in one or both of the gaps of the above-described core for an electric current detector, and inserting a busbar into the center of the core main body.

A method for manufacturing a core for an electric current detector of the present invention includes:

a step of preparing an annular core main body;

a partial molding forming step of forming a first partial molding and a second partial molding by covering portions of the core main body with resin;

a first gap forming step of forming a first gap by cutting the first partial molding and the core main body in a radial direction at a position at which the first partial molding is formed; and a second gap forming step of forming a second gap by cutting the second partial molding and the core main body in a radial direction at a position at which the second partial molding is formed, wherein the first gap forming step and/or the second gap forming step is performed such that the first partial molding and/or the second partial molding is not completely cut and a bridge portion made of the resin serving as a connection portion is left over.

With the core for an electric current detector according to the present invention, when the first gap and the second gap are formed in the core by cutting the core main body, the core pieces are connected via the first partial molding and the second partial molding that are made of resin and cover portions of the core pieces. At least one of the first partial molding and the second partial molding includes the bridge portion serving as a connection portion, and therefore, the pair of the core pieces will not come apart due to the bridge portion even when the first gap and the second gap are formed. Accordingly, incorporating the core into an electric current detector in this state makes it possible to maintain the pair of the core pieces formed from the same core main body. Therefore, even when a wound core obtained by winding a belt-shaped steel plate is used as the core, it is possible to avoid the pairing of core pieces produced from different core main bodies and use a combination of core pieces obtained from the same core main body after the first gap and the second gap have been formed. Accordingly, the cross-sectional surfaces that are opposed to each other with the gap being interposed therebetween have substantially the same area, and the degrees of looseness of the core pieces due to the restoring force of the belt-shaped steel plates are also substantially the same. This makes it possible to prevent a decrease in magnetic permeability, thus making it possible to achieve stable magnetic characteristics or magnetic saturation characteristics as well as the desired linearity or error rate. Even in the case of a core main body in which gaps are formed at asymmetric positions, such paring can be ensured.

With the core for an electric current detector according to the present invention, the spaces in the gaps can be maintained due to the bridge portions spanning the first gap and/or the second gap, thus making it possible to eliminate the need to adjust the gaps and the like when incorporating the core into an electric current detector. Resin is not molded around the entire core main body but is molded around portions of the core main body, and therefore, stress applied from the moldings to the core due to linear expansion during molding of resin through insert molding or the like and during use of the core can be reduced, thus making it possible to stabilize the magnetic characteristics.

A magnetism detecting element can be arranged in one of the gaps formed in the core, and the other can be used to prevent magnetic saturation. A configuration is also possible in which a high-current magnetism detecting element and a low-current magnetism detecting element are arranged in the first gap and the second gap, respectively, to detect a high electrical current and a low electrical current. Also, the redundancy may be achieved by arranging the same or equivalent magnetism detecting elements in the first gap and the second gap in preparation for the occurrence of a problem in one magnetism detecting element.

With the method for manufacturing a core for an electric current detector of the present invention, the core main body is provided with the first partial molding and the second partial molding in advance at positions at which the first gap and the second gap are to be formed, and then the first gap and the second gap are formed in the regions provided with the partial moldings. In the gap forming step, the first partial molding and/or the second partial molding is not completely cut to leave a portion thereof over as the bridge portion, and therefore, the core pieces do not come apart after the gaps have been formed. Accordingly, as mentioned above, the pair of the core pieces do not come apart, and in addition, the spaces in the gaps can be maintained.

DETAILED DESCRIPTION OF THE INVENTION

Hereinafter, a core 10 according to an embodiment of the present invention will be described with reference to the drawings.

Figure 1:
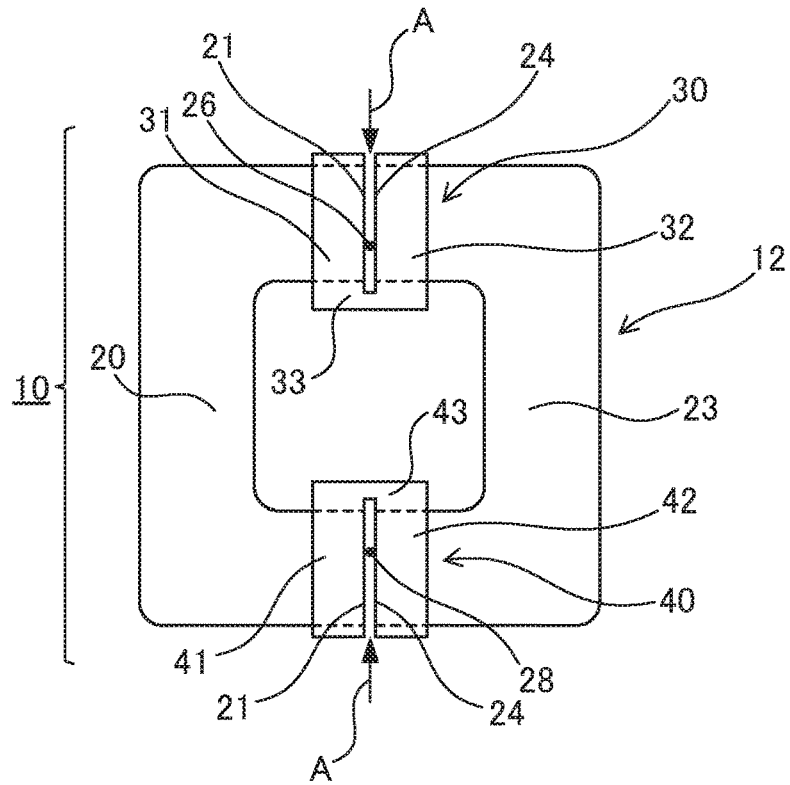
FIG. 1 is a plan view of a core according to an embodiment of the present invention.

FIG. 1 is a plan view of the core 10 according to an embodiment of the present invention. The core 10 includes core pieces 20 and 23 obtained by cutting an annular core main body 12 at two positions, and has a configuration in which the core pieces 20 and 23 are arranged such that cross-sectional surfaces 21 and 24 of the core pieces 20 and 23 are opposed to each other so as to form a first gap 26 and a second gap 28 therebetween. The core pieces 20 and 23 are provided with partial moldings 30 and 40 that are made of resin and cover portions of the peripheral surfaces (outer peripheral surfaces) of the cross-sectional surfaces 21 and 24 opposed to each other with the gaps 26 and 28 being interposed therebetween. Hereinafter, the two partial moldings are referred to as a first partial molding 30 and a second partial molding 40 as appropriate. Although the gaps 26 and 28 are formed at two positions in the embodiment shown in the diagram, three or more gaps may also be formed if a plurality of gaps are to be formed.

It is desirable that portions of the partial moldings 30 and 40 for forming bridge portions 33 and 43, which will be described below, are thicker than the remaining portion as shown in FIG. 1. This makes it possible to reduce the thicknesses of the partial moldings 30 and 40 as a whole while the bridge portions 33 and 43 can be reliably left over when the gaps 26 and 28 are formed by cutting the core main body.

In the core 10, at least one of, but desirably both of, the partial moldings 30 and 40 spanning the gaps 26 and 28 include the bridge portions 33 and 43 as connection portions as shown in FIG. 1 such that the core pieces 20 and 23 obtained by dividing the core main body into a plurality of portions do not come apart and at least an annular form can be maintained. In the embodiment shown in the diagram, in the first partial molding 30, a first-1 molded member 31 that is formed around the cross-sectional surface 21 of the core piece 20, which is one of the core pieces, and a first-2 molded member 32 that is formed around the cross-sectional surface 24 of the core piece 23, which is the other of the core pieces, are connected via the bridge portion 33. In the second partial molding 40, a second-1 molded member 41 that is formed around the cross-sectional surface 21 of the core piece 20, which is one of the core pieces, and a second-2 molded member 42 that is formed around the cross-sectional surface 24 of the core piece 23, which is the other of the core pieces, are connected via the bridge portion 43.

The core 10 of the present invention can be used as a component of an electric current detector. For example, an electric current sensor is formed by inserting a magnetism detecting element into one or both of the gaps 26 and 28 and inserting a busbar through the central opening. The gap into which no magnetism detecting element is inserted acts as a gap for preventing magnetic saturation, for example. Although the gaps 26 and 28 have the same width in the diagram, a configuration is also possible in which the width of the gap into which a magnetism detecting element is to be inserted is increased, and the width of the gap for preventing magnetic saturation is reduced.

In the present invention, the core pieces 20 and 23 are formed by cutting the annular core main body 12. The core main body 12 can be made of a magnetic material, and examples thereof include a wound core obtained by winding a thin plate made of a magnetic material and annealing the wound thin plate, a laminated core obtained by stacking annular thin plates made of a magnetic material, and a dust core obtained by molding powder made of a magnetic material through compression molding. With the present invention, the pair of the core pieces 20 and 23 can be maintained without mistakes when the core main body 12 is cut, and therefore, the present invention is particularly suitable for a wound core that has been wound a different number of times between at the start of winding of the thin plate around the core main body 12 and at the end of winding the thin plate, and a core in which the gaps 26 and 28 are formed at positions shifted from the center and that includes core pieces 20 and 23 whose shapes are asymmetric.

The partial moldings 30 and 40 are made of an electrical insulating resin, and can be formed around the core main body 12 through insert molding or the like. Examples of the resin include PPS (polyphenylene sulfide resin), PBT (polybutylene terephthalate resin), and PET (polyethylene terephthalate resin). For example, insert molding can be performed by arranging the core main body 12 in a mold provided with a recess corresponding to the core main body 12 and the partial moldings 30 and 40, injecting molten resin using any of various injection molding machines, and curing the resin. The partial moldings 30 and 40 are provided to cover portions of the core main body 12, that is, cover portions of the outer periphery of the core main body 12. If a molding is formed around the entire core main body 12, stress will be applied to the core main body 12 during insert molding, and stress caused by the difference in the linear expansion coefficient between the material of the core main body 12 and the resin to be molded will be applied to the core main body 12 after insert molding. Thus, there is a risk that the magnetic characteristics will become unstable. On the other hand, when the partial moldings 30 and 40 are provided around portions of the core main body 12, it is possible to suppress the occurrence of such stress and stabilize the magnetic characteristics of the core main body 12.

Figure 2:
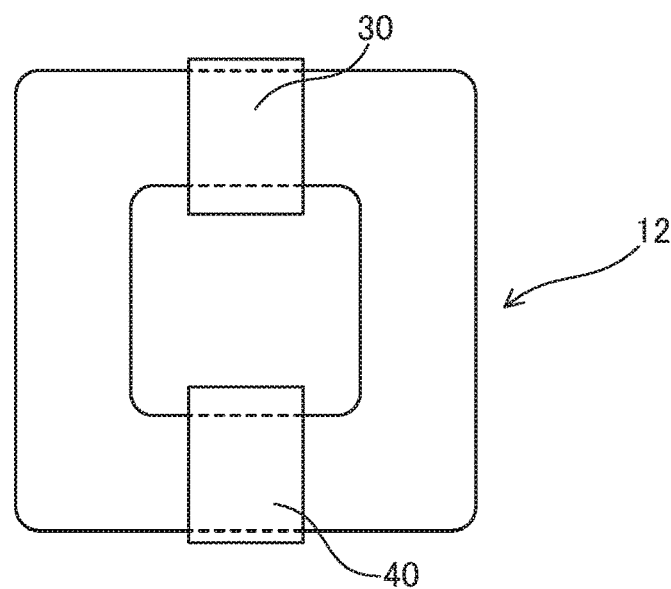
FIG. 2 is a plan view showing a state in which partial moldings are formed around a core main body.

As shown in FIG. 2, in the core 10 of the present invention, the partial moldings 30 and 40 are formed according to the above-mentioned procedure at positions on the annular core main body 12 at which the gaps 26 and 28 are to be formed (partial molding forming step). Although the core main body 12 is a rectangular annular article in the embodiment shown in the diagram, the core main body 12 may also have a circular shape, an elliptical shape, or the like. Although the partial moldings 30 and 40 are formed on the sides of the core main body 12 that are opposed to each other, the partial moldings 30 and 40 can also be formed on the adjacent sides or the same side. If the gaps 26 and 28 are formed at positions shifted from the center of the core main body 12, it is necessary to form the partial moldings 30 and 40 at the corresponding positions.

Then, the gaps 26 and 28 are formed in the core main body 12 using a dicing blade or the like at the positions at which the partial moldings 30 and 40 are formed. The formation of the gaps 26 and 28 is continued until the core main body 12 is completely cut in the radial direction and divided into two core pieces 20 and 23 (first gap forming step, second gap forming step). At this time, the partial moldings 30 and 40 are not completely cut as shown in FIG. 1, and portions thereof are left over such that the first-1 molded member 31 and the first-2 molded member 32, which are separated from each other with the first gap 26 being interposed therebetween, are connected via the bridge portion 33, and the second-1 molded member 41 and the second-2 molded member 42, which are separated from each other with the second gap 28 being interposed therebetween, are connected via the bridge portion 43. For example, when the gaps 26 and 28 are formed by inserting a dicing blade into the core main body 12 in the radial direction as indicated by arrows A shown in FIG. 1, the core main body 12 can be cut such that the bridge portions 33 and 43 are left over on the inner diameter side. When the core main body 12 is cut from a lateral surface side, the respective bridge portions 33 and 43 are left over on the other lateral side. Although the thicknesses of the uncut bridge portions 33 and 43 need to be taken into consideration depending on the type of resin, it is desirable to secure a thickness of 1 mm or more for PPS, for example. It should be noted that the widths of the gaps 26 and 28 can be adjusted as appropriate by changing the thickness of the dicing blade.

In a specific embodiment, when a dicing blade to be used to cut the core main body 12 and the partial moldings 30 and 40 has a diameter of about 10 cm to 22.5 cm, wet cutting can be performed under the condition where the rotation number of a grinding stone is set to approximately 2000 rpm. In order to completely cut the core main body 12 and leave the bridge portions 33 and 43 over, it is desirable to employ an automatic cutting machine equipped with a moving table that keeps the level of the core main body 12 and the level of a grinding stone constant at all times.

Forming the gaps 26 and 28 at the positions at which the partial moldings 30 and 40 were formed in advance as mentioned above can make it less likely that swarf of the core main body 12 will remain on the cross-sectional surfaces 21 and 24 when a dicing blade is used to cut the core main body 12. In particular, in the case where a wound core is used as the core main body 12, forming the partial moldings 30 and 40 makes it possible to prevent metal burr and splinters, which cause conductive foreign matters that are undesirable in electronic components, from occurring on the cross-sectional surfaces 21 and 24 while the gaps 26 and 28 are being formed.

As shown in FIG. 1, in the core 10 in which the gaps 26 and 28 are formed, the gap 26 and 28 are formed between the cross-sectional surfaces 21 and 24 of the core pieces 20 and 23, and the state in which the core pieces 20 and 23 are connected to each other is maintained by the first partial molding 30 and the second partial molding 40 including the bridge portions 33 and 43 as connection portions. Accordingly, the core main body 12 is divided into two core pieces 20 and 23 in the process of cutting the core main body 12 to form the gaps 26 and 28, but the core pieces 20 and 23 do not come apart due to the partial moldings 30 and 40, and the annular form can thus be maintained. Therefore, the pair of the core pieces 20 and 23 formed from the same core main body 12 do not come apart. In addition, the spaces in the gaps 26 and 28 between the core pieces 20 and 23 are kept constant due to the bridge portions 33 and 43, and it is thus unnecessary to adjust the widths of the gaps.

The obtained core 10 can be used as an electric current detector by inserting a busbar into the center of the core 10 and arranging a magnetism detecting element in one of the gaps 26 and 28. The gap in which no magnetism detecting element is arranged can be used to adjust magnetic saturation. It will be appreciated that magnetism detecting elements may also be arranged in both the gaps 26 and 28. In this case, using a high-current magnetism detecting element as one of these magnetism detecting elements and a low-current magnetism detecting element as the other is advantageous in that inexpensive magnetism detecting elements that detect a relatively narrow range can be employed instead of expensive magnetism detecting elements that can detect magnetism in a broad range from a low electric current to a high electric current. Also, the same or equivalent magnetism detecting elements can be employed for the gaps 26 and 28. This enables switching of the magnetism detecting elements when a problem occurs. That is, the redundancy of the electric current detector can be achieved. Also, the detection accuracy can be improved by determining the average of outputs from both the magnetism detecting elements.

It should be noted that there is a risk that the spaces in the gaps 26 and 28 will increase or decrease at the operating temperature of the core 10 (e.g., −40° C. to 130° C.) due to linear expansion of the resin constituting the partial moldings 30 and 40. In such a case, it is desirable to use, in the partial moldings 30 and 40, a resin having a linear expansion coefficient close to that of the material of the core main body 12. For example, when a silicon steel plate having a linear expansion coefficient of about $1.17 \times 10^{-5}/°$ C. to $1.2 \times 10^{-5}/°$ C. is used in the core main body 12, PPS having a linear expansion coefficient of about $1.7 \times 10^{-5}/°$ C. to $2.5 \times 10^{-5}/°$ C. can be used as resin for the partial moldings 30 and 40.

With the core 10 of the present invention, the pair of the core pieces 20 and 23 do not come apart since the partial moldings 30 and 40 are provided in advance at positions at which a plurality of gaps 26 and 28 are to be formed before the gaps 26 and 28 are formed, and the partial moldings 30 and 40 are not completely cut and the bridge portions 33 and 43 are thus left over when the gaps 26 and 28 are formed. Accordingly, the configuration of the core 10 of the present invention is particularly suitable for a wound core. Applying the present invention to a wound core makes it possible to allow the cross-sectional surfaces 21 and 24 of the core pieces 20 and 23, which are determined by the winding number or winding strength of an electromagnetic steel plate, to have substantially equal areas. Furthermore, when the core pieces 20 and 23 are obtained from the same core main body 12 by cutting the core main body 12, irrespective of the occurrence of the residual stress due to the winding step, the annealing step, the varnish impregnation step, and the like performed on the core, the degrees of looseness of the core pieces 20 and 23 due to the restoring force after the cutting are also substantially the same, and therefore, the cross-sectional surfaces 21 and 24 are favorably opposed to each other when the core pieces 20 and 23 are arranged to face each other with the gaps 26 and 28 being interposed therebetween. Therefore, it is possible to suppress a decrease in magnetic permeability caused by a difference in the cross-sectional area or misalignment of the cross-sectional surfaces, to suppress the variability of magnetic characteristics or magnetic saturation characteristics, and to suppress the influence on the linearity or error rate. The bridge portions 33 and 43 also have an effect of insulating the busbar from the core main body 12. It is also possible to maintain even the pair of core pieces 20 and 23 whose shapes are asymmetric due to the positions at which the gaps 26 and 28 are formed, thus making it possible to reduce assembly mistakes.

Figure 3:
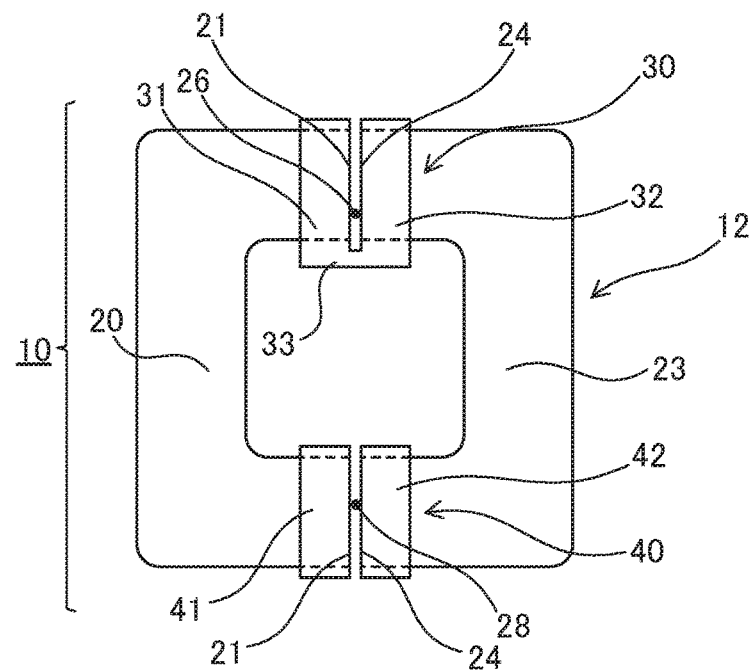
FIG. 3 is a plan view of a core according to another embodiment of the present invention.

Although the bridge portions 33 and 43 are left over in both the partial moldings 30 and 40 when the gaps 26 and 28 are formed in the above-mentioned embodiment, a configuration as shown in FIG. 3 may also be employed in which the bridge portion 33 is left over in the partial molding 30, which is one of the partial moldings, when the gap 26 is formed, and the partial molding 40, which is the other of the partial moldings, is completely cut and no bridge portion is left over when the gap 28 is formed. In this case, the partial molding 40 is divided, but the core has only one separation position, and thus the core pieces 20 and 23 do not come apart and are connected via the bridge portion 33, thus making it possible to maintain the pair of the core pieces 20 and 23. In this case, the core main body can also be cut using a dicing blade in the direction indicated by arrow B as shown in FIG. 4, and the bridge portion 33 can be formed on the outer diameter side of the partial molding 30, which is cut later.

Figure 4:
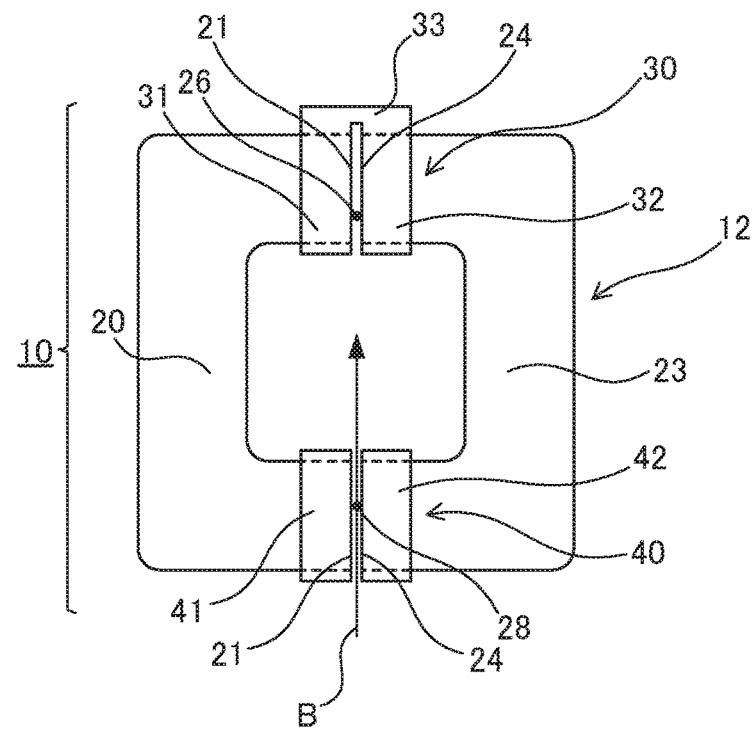
FIG. 4 shows a modified example of the core shown in FIG. 3.
Figure 5:
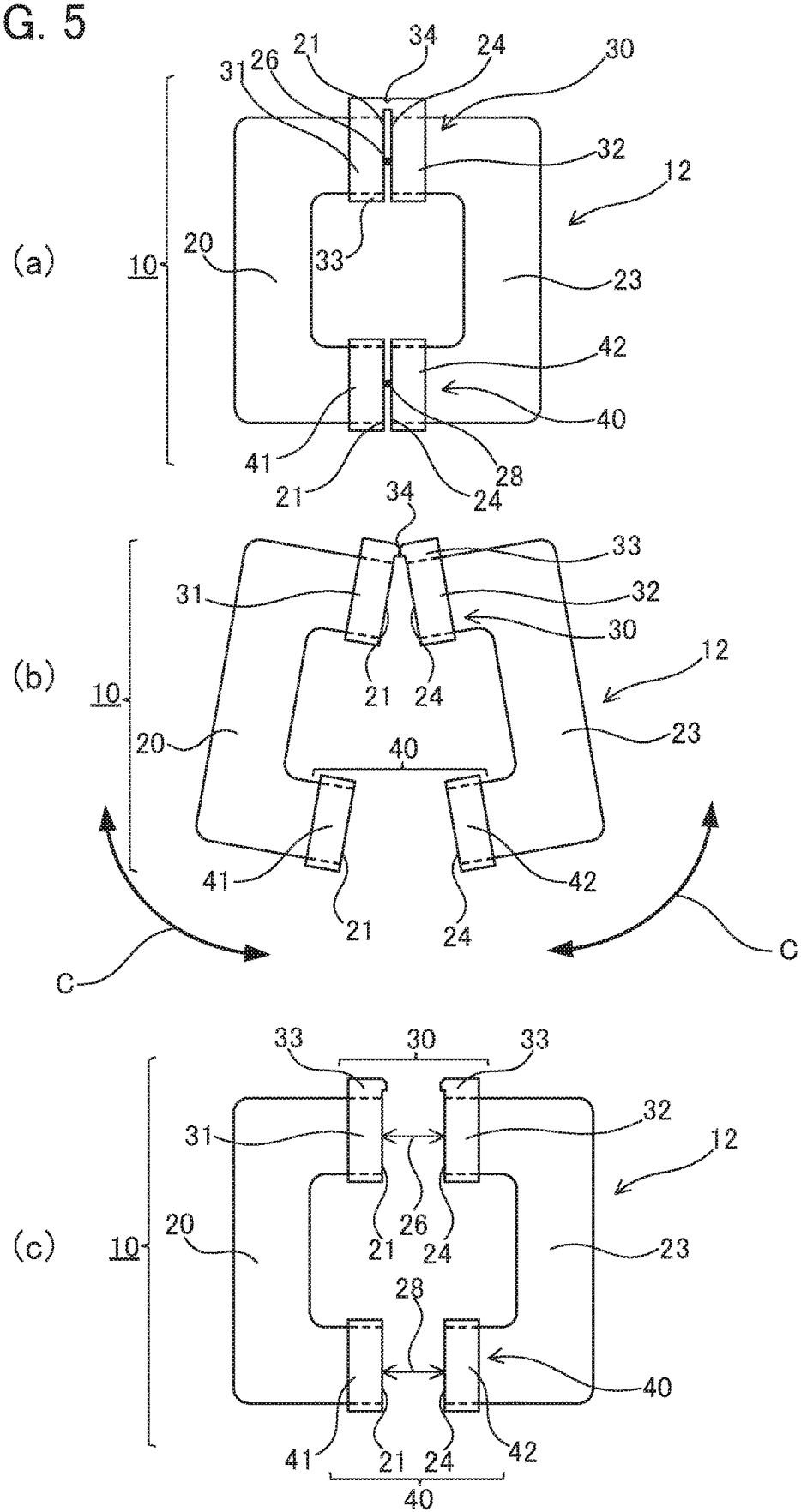
FIG. 5 is an explanatory diagram showing an example in which a bridge portion is provided with a groove and can be cut by moving the core pieces to bend the bridge portion.

In the case where only the bridge portion 33 is left over in the partial molding 30, which is one of the partial moldings when the gap 26 is formed and the partial molding 40, which is the other of the partial moldings, are completely cut as shown in FIG. 4, a groove 34 can be formed in the bridge portion 33 in the width direction as shown in FIG. 5(a). By holding the core pieces 20 and 23 and applying force to the bridge portion 33 one or more times in a direction in which the width of the groove 34 is reduced (indicated by arrows C in FIG. 5(b)) as shown in FIG. 5(b), it is possible to fold the bridge portion 33 at the groove 34 and cut the partial molding 40 into two pieces, namely the first-1 molded member 31 and the first-2 molded member 32, as shown in FIG. 5(c). This makes it possible to separate the core pieces 20 and 23 and incorporate them into an electric current detector with the widths of the gaps 26 and 28 being set in accordance with a requirement for the electric current detector. It should be noted that the bridge portion 33 may also be made thinner instead of forming the groove 34 such that the bridge portion 33 can be easily folded and cut.

The foregoing description is intended to illustrate the present invention, and should not be construed as limiting the invention defined in the claims or as restricting the scope of the invention. Also, the configuration of each element of the invention is not limited to the foregoing examples, and various modifications can be made within the technical scope of the claims.

For example, although the gaps 26 and 28 have the same width in the above-mentioned embodiment, they may also have different widths. It is sufficient that the partial moldings 30 and 40 are formed at at least positions at which the gaps 26 and 28 are to be formed, and a partial molding for positioning in a casing or the like of an electric current detector can also be provided additionally.

What is claimed is:

1. A core for an electric current detector, comprising:
   a pair of core pieces formed by cutting an annular core main body in a radial direction at two positions, the core pieces being arranged such that cross-sectional surfaces thereof are opposed to each other with a first gap and a second gap being interposed therebetween; and
   a first partial molding and a second partial molding that are made of resin and cover portions of peripheral surfaces of the cross-sectional surfaces of the core pieces opposed to each other with the first gap and the second gap being interposed therebetween,
   wherein the first partial molding comprises a first-1 molded member that covers a peripheral surface of one of the cross-sectional surfaces of the core pieces opposed to each other with the first gap being interposed therebetween, and a first-2 molded member that covers a peripheral surface of the other of the cross-sectional surfaces of the core pieces,
   the second partial molding comprises a second-1 molded member that covers a peripheral surface of one of the cross-sectional surfaces of the core pieces opposed to each other with the second gap being interposed therebetween, and a second-2 molded member that covers a peripheral surface of the other of the cross-sectional surfaces of the core pieces,
   in the first partial molding, the first-1 molded member and the first-2 molded member are connected via a bridge portion made of the resin,
   in the second partial molding, the second-1 molded member and the second-2 molded member are not connected, and
   the bridge portion of the first partial molding has a reduced thickness portion at a position in alignment with the first gap,
   the reduced thickness portion being adapted to break and separate when the core pieces are operated to move the second-1 molded member and the second-2 molded member toward and away from each other.

2. The core for an electric current detector according to claim 1,
   wherein the bridge portion is formed on an inner diameter side.

3. The core for an electric current detector according to claim 1,
   wherein the bridge portion is formed on an outer diameter side.

4. An electric current detector obtained by arranging a magnetism detecting element in one or both of the gaps of the core for an electric current detector according to claim 1, and inserting a busbar into the center of the core main body.

5. An electric current detector obtained by arranging a magnetism detecting element in one or both of the gaps of the core for an electric current detector according to claim 2, and inserting a busbar into the center of the core main body.

6. An electric current detector obtained by arranging a magnetism detecting element in one or both of the gaps of the core for an electric current detector according to claim 3, and inserting a busbar into the center of the core main body.

* * * * *